(12) United States Patent
Norimatsu

(10) Patent No.: US 8,704,528 B2
(45) Date of Patent: Apr. 22, 2014

(54) METHOD AND APPARATUS FOR INSPECTING ELECTRONIC COMPONENT

(75) Inventor: Kenji Norimatsu, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 699 days.

(21) Appl. No.: 12/887,420

(22) Filed: Sep. 21, 2010

(65) Prior Publication Data

US 2011/0215812 A1 Sep. 8, 2011

(30) Foreign Application Priority Data

Mar. 5, 2010 (JP) .................................. 2010-48842

(51) Int. Cl.
*G01R 31/02* (2006.01)
(52) U.S. Cl.
USPC ....... 324/537; 324/754.22; 250/310; 250/307
(58) Field of Classification Search
None
See application file for complete search history.

(56) References Cited

U.S. PATENT DOCUMENTS

| 6,900,645 | B2 * | 5/2005 | Yamada | 324/754.22 |
| 2006/0054813 | A1 * | 3/2006 | Nokuo et al. | 250/307 |

FOREIGN PATENT DOCUMENTS

| EP | 652444 A1 * | 5/1995 |
| JP | 07-128409 A2 | 5/1995 |
| JP | 2000-124276 A2 | 4/2000 |
| JP | 2002-368049 A2 | 12/2002 |
| JP | 2008-211111 | 9/2008 |
| JP | 2008-270632 | 11/2008 |

OTHER PUBLICATIONS

Machine English translation of Japanese Patent Application Publication to Applicants Nozoe M et al. JP 2002-368049 A, Dec. 20, 2002. Translation of pp. 2-11 created on Mar. 15, 2013.*
Machine English translation of Japanese Patent Application Publication to Applicants Keizo, Yamada, JP 2000-124276 A, Apr. 28, 2000. Translation of pp. 1-20 created on Aug. 10, 2012.*
Cole, Edward I, Resistive Contrast Imaging Applied to Multilevel Interconnection Failure Analysis, 1989, IEEE, Proceedings of the Sixth International VLSI Multilevel Interconnection Conference, pp. 176-182.*
Office Action for Japanese Application 2010-048842, mailed Jul. 24, 2012.
Background Art Information in 1 page.
Office Action for Japanese Application 2010-048842, mailed May 24, 2013.

* cited by examiner

*Primary Examiner* — Melissa Koval
*Assistant Examiner* — Stephen G Armstrong
(74) *Attorney, Agent, or Firm* — Knobbe Martens Olson & Bear LLP

(57) ABSTRACT

In one embodiment, a method for inspecting an electronic component includes preparing a current detector which is electrically connected to a current detection terminal via a gating device, and electrically connecting the current detection terminal to an interconnect which is in the electronic component and on which a failure portion is suspected to be generated. The method further includes pulsing an electron beam and irradiating the interconnect with the electron beam, and detecting a current generated when the interconnect is irradiated with the electron beam, by the current detector, while adjusting an opening and a closing of a gate in the gating device.

5 Claims, 6 Drawing Sheets

METHOD AND APPARATUS FOR INSPECTING ELECTRONIC COMPONENT

CROSS REFERENCE TO RELATED APPLICATION

This application is based upon and claims the benefit of priority from the prior Japanese Patent Application No. 2010-48842, filed on Mar. 5, 2010, the entire contents of which are incorporated herein by reference.

FIELD

Embodiments described herein relate to a method and an apparatus for inspecting an electronic component, for example, to be used for specifying a failure portion of a semiconductor device.

BACKGROUND

An absorbed current method has been used as a technique for specifying a failure portion of an interconnect in a semiconductor device. In the absorbed current method, an absorbed current amplifier (i.e., current detector) is connected to an interconnect narrowed down as being troubled, a region including the interconnect is irradiated with an electron beam, and a current image whose luminance is modulated according to the amount of the current flowing in the absorbed current amplifier is generated, thereby specifying a failure portion.

In this case, if the interconnect on a side of the detector with respect to a broken portion is irradiated with the electron beam, the current reaches the detector. In contrast, if the interconnect on a side opposite to the detector with respect to the broken portion is irradiated with the electron beam, the current cannot reach the detector. Therefore, if a difference between detected current amounts is modulated in term of luminance, and a current image is then generated by associating the difference with a position irradiated with the electron beam, a great difference in luminance is generated between the broken portion and an unbroken portion within the current image, and therefore the failure portion can be distinguished at a glance. The current image is generated, for example, by lighting a portion of a large current amount and darkening a portion of a small current amount.

An advantage of the absorbed current method resides in that the failure portion can be checked on the current image at a glance. This is because a portion to be originally interconnected does not appear in the current image in the case of an open trouble, whereas an interconnect not to originally appear in the current image appears in the current image in the case of a short trouble. However, in the case where the open trouble is not a complete open (i.e., a resistance≈∞) but a high resistance open (i.e., a resistance≠∞), there arises a problem that the detection of the failure portion becomes more difficult as the resistance becomes lower. The reason will be explained below.

In an equivalent circuit of a measurement system for the absorbed current method, an electron gun to generate an electron beam is represented by a constant current source having a predetermined output impedance $Z$. On the other hand, a high resistance open portion is represented by a predetermined resistance $R$. Further, moving a position irradiated with the electron beam on the interconnect corresponds to moving a connection point between the constant current source and the interconnect.

At this time, in the case where the relationship of $Z \gg R$ is established between the output impedance $Z$ and the resistance $R$, there is no great difference in amount of a current flowing in the detector, irrespectively of whether the constant current source is connected onto the side of the detector with respect to the resistance $R$, or on the side opposite to the detector. In other words, as long as the relationship of $Z \gg R$ is established, a contrast on the current image is not varied near the high resistance open portion, or is very slight if varied. In this case, it is very difficult to recognize the high resistance open portion on the current image.

To overcome the difficulty, there have proposed some methods for detecting a slight change in resistance. In one method, one end of a suspected interconnect (i.e., interconnect suspected to be troubled) is grounded whereas the other end is connected to a detector. In another method, currents are drawn from both ends (starting point and ending point) of a suspected interconnect to differentially amplify the currents.

In the former method, the interconnect is grounded with low impedance, so that the influence of the output impedance of the constant current source need not be considered, and an absorbed current amount is changed according to the relationship between a ground resistance and a trouble resistance. Theoretically, as the ground resistance becomes smaller, this method can be more applied to a smaller trouble resistance.

In the latter method, a ratio of the currents drawn from the both ends depends on a ratio of a resistance generated between the starting point and the position irradiated with the electron beam to a resistance generated between the ending point and the position irradiated with the electron beam. Therefore, a change in resistance on the suspected interconnect can be detected by imaging the ratio of the currents.

Both of the methods are effective. However, in these methods, at least two points in the suspected interconnect need be probed for observation.

An interconnect in a semiconductor device is outputted from a gate and inputted into the gate. In other words, even if intermediate portions of the interconnect is located in an upper layer, the starting and ending points of the interconnect are ordinarily connected to input and output terminals of the gate located in a lowermost layer. Therefore, unless a failure portion in a suspected interconnect is previously found to be in an interconnect portion drawn on the upper layer, at least one portion ordinarily need be probed at the lowermost layer.

However, in a recent semiconductor device in which many interconnect layers are stacked, it is very difficult to connect a probe to an interconnect portion in a lowermost layer without damaging an interconnect portion in an upper layer, and therefore this is not practical. Should the probe be connected to two points in the lowermost layer, in the case where the interconnect is fanned out at plural portions with branches on the way, measurement need be repeated many times unless it is known in which branch a trouble is generated.

In conclusion, the technique for probing the suspected interconnect at two points is effective but not practical, and it is not impossible but difficult in practical use. Therefore, it is ideal in an inspection by the absorbed current method that measurement can be performed by the connection to the suspected interconnect in the upper layer at one point. In addition, it is desirable that the measurement by the connection at one point should enable the high resistance open trouble to be detected.

JP-A 2008-270632 (KOKAI) discloses an inspection apparatus for scanning with a charged beam while vibrating a position irradiated with the charged beam. On the other hand, JP-A 2008-211111 (KOKAI) discloses a sample inspection apparatus having a plurality of probes.

DETAILED DESCRIPTION

Embodiments will now be explained with reference to the accompanying drawings.

An embodiment described herein is, for example, a method for inspecting an electronic component, the method including preparing a current detector which is electrically connected to a current detection terminal via a gating device, and electrically connecting the current detection terminal to an interconnect which is in the electronic component and on which a failure portion is suspected to be generated. The method further includes pulsing an electron beam and irradiating the interconnect with the electron beam, and detecting a current generated when the interconnect is irradiated with the electron beam, by the current detector, while adjusting an opening and a closing of a gate in the gating device.

Another embodiment described herein is, for example, an apparatus for inspecting an electronic component, the apparatus including a current detection terminal to be electrically connected to an interconnect which is in the electronic component and on which a failure portion is suspected to be generated, and a current detector electrically connected to the current detection terminal, and configured to detect a current generated in the interconnect. The apparatus further includes a gating device provided between the current detection terminal and the current detector, and configured to switch an opening and a closing of a gate so as to control whether or not the current is allowed to pass through the gate, and an electron gun configured to generate an electron beam. The apparatus further includes a pulse beam generator configured to pulse the electron beam, and a gating adjustor configured to adjust the opening and the closing of the gate in the gating device, when the current detector detects the current generated when the interconnect is irradiated with the pulsed electron beam.

Another embodiment described herein is, for example, a method for inspecting an electronic component, the method including detecting a current generated in an interconnect by a current detector electrically connected to the interconnect via a gating device while adjusting an opening and a closing of a gate in the gating device, the current being generated when the interconnect which is in the electronic component and on which a failure portion is suspected to be generated is irradiated with a pulsed electron beam. The method further includes generating a current image expressing a relationship between a position irradiated with the electron beam and the current detected by the current detector.

Figure 1:
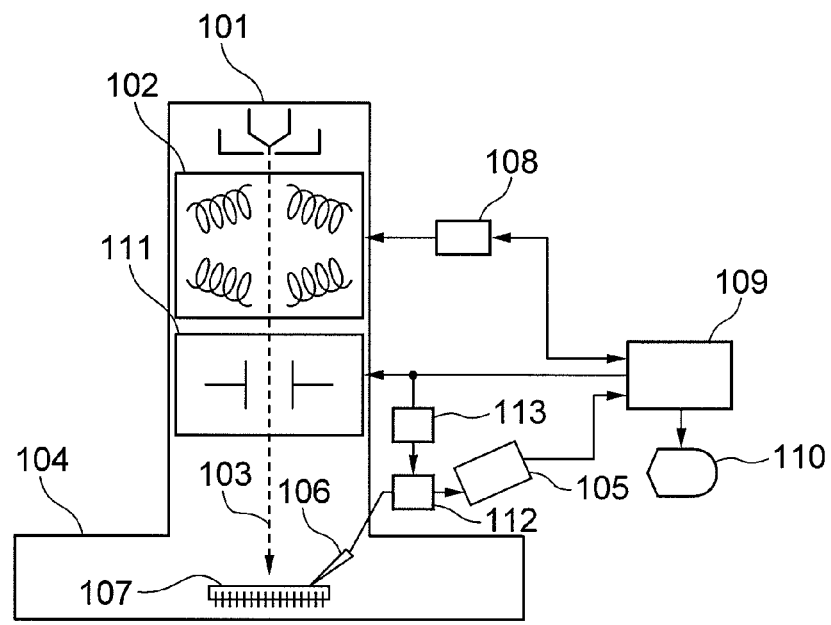
FIG. 1 is a system diagram showing an apparatus for inspecting a semiconductor device according to an embodiment of the disclosure.

FIG. 1 is a system diagram showing an apparatus for inspecting a semiconductor device according to an embodiment of the disclosure.

FIG. 1 illustrates a semiconductor device 107 to be inspected, which an example of an electronic component of the disclosure. The semiconductor device 107 is securely contained inside of a vacuum sample chamber 104, and is irradiated on its interconnect with an electron beam 103 which has been finely focused.

The electron beam 103 is generated by an electron gun 101, and can perform scanning by a deflector 102 electrically connected to a deflection controller 108. In the inspecting apparatus illustrated in FIG. 1, the semiconductor device 107 is irradiated at a desired position with the electron beam 103 by deflecting the path of the electron beam 103 by the deflector 102.

A controlling computer 109 is electrically connected to the deflection controller 108. The controlling computer 109 can control the deflector 102 via the deflection controller 108 so as to control the irradiation position of the electron beam 103. A display 110 is electrically connected to the controlling computer 109.

A current detection terminal 106 is to be electrically connected to a suspected interconnect (i.e., interconnect which is suspected as being troubled) of the semiconductor device 107. In the absorbed current method, the operation of the semiconductor device 107 is checked by a tester or by simulation, thereby narrowing down the suspected interconnect, followed by inspecting the narrowed-down interconnect. Here, the current detection terminal 106 is referred to also as a probe needle.

The current detection terminal 106 is electrically connected to an absorbed current amplifier 105 (via a gating device 112 described below). The absorbed current amplifier 105 is an example of a current detector of the disclosure.

In the inspecting apparatus illustrated in FIG. 1, the suspected interconnect is irradiated with the electron beam 103 in the state in which the current detection terminal 106 is brought into contact with the suspected interconnect. In this manner, a current caused by the electron beam 103 is generated inside of the suspected interconnect. The current flows in the absorbed current amplifier 105 through the suspected interconnect, to be detected by the absorbed current amplifier 105.

The value of the current detected by the absorbed current amplifier 105 is taken into the controlling computer 109, and is then subjected to various computations. Thereafter, the controlling computer 109 associates the irradiation position of the electron beam 103 with the current value so as to generate a current image. The current image represents the relationship between the irradiation position of the electron beam 103 and the value of the current detected by the absorbed current amplifier 105. In the present embodiment, the current image is generated by modulating the luminance of each pixel according to the amount of current flowing in the absorbed current amplifier 105. Here, the controlling computer 109 is an example of a current image generator of the disclosure.

Image data on the current image generated by the controlling computer 109 is transmitted to the display 110. Then, the current image is displayed on the display 110. When a user sees the displayed current image, he or she can specify a failure portion at the interconnect of the semiconductor device 107. In the case where a failure portion is observed, a physical analysis of the semiconductor device 107 is conducted around the failure portion, resulting in a change in design of the semiconductor device 107 or a review of a fabricating process. Here, the display 110 is an example of a current image display of the disclosure.

The inspecting apparatus illustrated in FIG. 1 further includes a pulse beam generator 111, the gating device 112, and a gating adjustor 113.

The pulse beam generator 111 is a device for pulsing the electron beam 103 generated by the electron gun 101, and is disposed at a rear stage of the electron gun 101 and the deflector 102. Consequently, the suspected interconnect is irradiated with the pulse electron beam 103.

The controlling computer 109 is electrically connected to the pulse beam generator 111. The controlling computer 109 can control the pulse beam generator 111 to pulse the electron beam 103, and can control the pulse width, pulse cycle, pulse generation timing and the like of the electron beam 103.

The gating device 112 is configured to gate a current, i.e., configured to control whether or not the current is allowed to pass through a gate by switching the opening and closing of the gate, and is provided between the current detection terminal 106 and the absorbed current amplifier 105.

The current flowing in the current detection terminal 106 from the suspected interconnect passes through the gating device 112 to reach the absorbed current amplifier 105 when the gate of the gating device 112 is opened. In contrast, when the gate of the gating device 112 is closed, the current is cut off, and therefore, cannot reach the absorbed current amplifier 105.

The gating adjustor 113 is a device for adjusting the opening and the closing of the gate of the gating device 112, and is electrically connected to the gating device 112.

The controlling computer 109 is electrically connected to the gating adjustor 113. The controlling computer 109 can control the gating device 112 via the gating adjustor 113 so as to control the opening and the closing of the gate, and can control the gate width, gate timing and the like of the gate.

In the inspecting apparatus illustrated in FIG. 1, the suspected interconnect is irradiated with the pulsed electron beam 103, whereby the current generated in the suspected interconnect is detected by the absorbed current amplifier 105, while adjusting the opening and the closing of the gate of the gating device 112.

Hereinafter, a general problem experienced by the absorbed current method will be described with reference to FIGS. 2 to 4, and subsequently, the operations and effects of the inspecting apparatus in the present embodiment will be described with reference to FIGS. 5 to 12.

Figure 2:
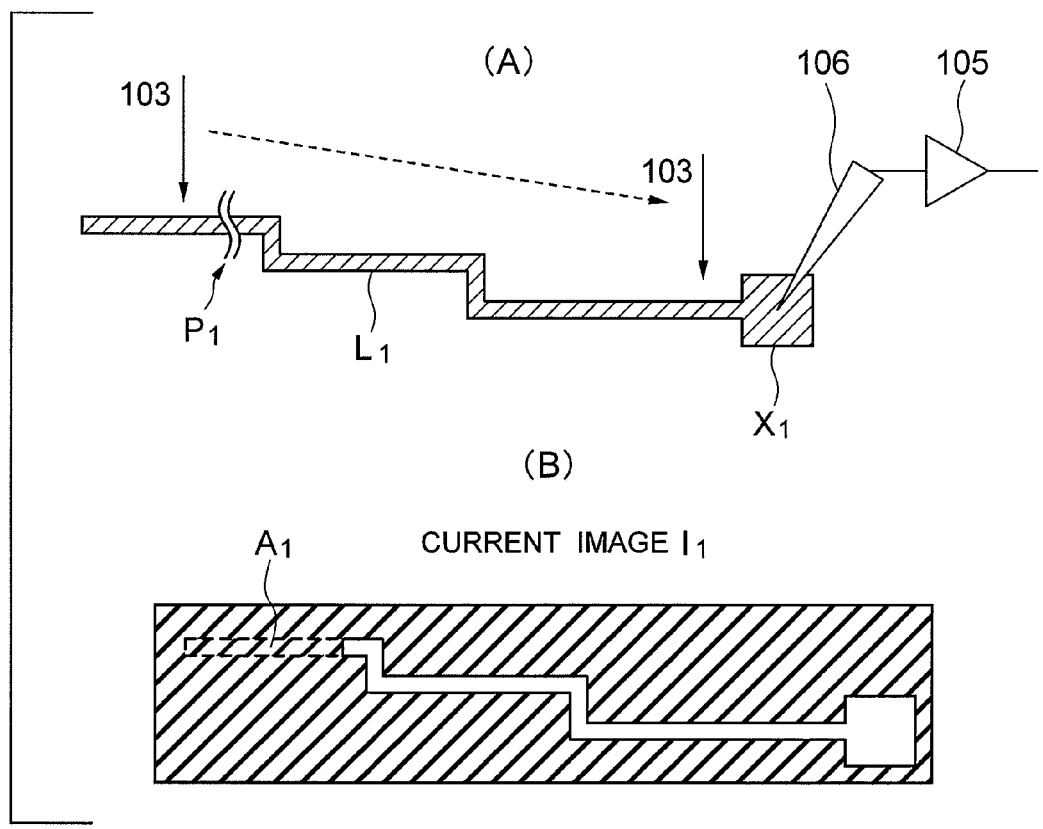
FIG. 2 shows a suspected interconnect including a fully open portion and a current image of the interconnect.

FIG. 2 shows a suspected interconnect including a fully open portion and a current image of the interconnect.

FIG. 2(A) illustrates a suspected interconnect $L_1$ including a fully open portion $P_1$. The fully open portion $P_1$ is generated by, for example, a breakage of the interconnect $L_1$. Moreover, FIG. 2(A) illustrates that the current detection terminal 106 is connected to an end $X_1$ on the suspected interconnect $L_1$, which is then irradiated with the electron beam 103, and therefore, the current generated in the suspected interconnect $L_1$ is detected by the absorbed current amplifier 105.

FIG. 2(B) illustrates a current image $I_1$ generated by the current detection illustrated in FIG. 2(A). In the current detection illustrated in FIG. 2(A), when the interconnect is irradiated with the electron beam 103 on the side of the end $X_1$, as viewed at the failure portion $P_1$, the current reaches the end $X_1$. In contrast, when the interconnect is irradiated with the electron beam 103 on the side opposite to the end $X_1$, as viewed at the failure portion $P_1$, the current cannot reach the end $X_1$.

Therefore, an interconnect area $A_1$ which should be ordinarily displayed is not displayed in the current image $I_1$. Here, the interconnect area $A_1$ corresponds to the interconnect located on the side opposite to the end $X_1$, as viewed at the failure portion $P_1$. The user can specify the failure portion $P_1$ based on the current image $I_1$.

Figure 3:
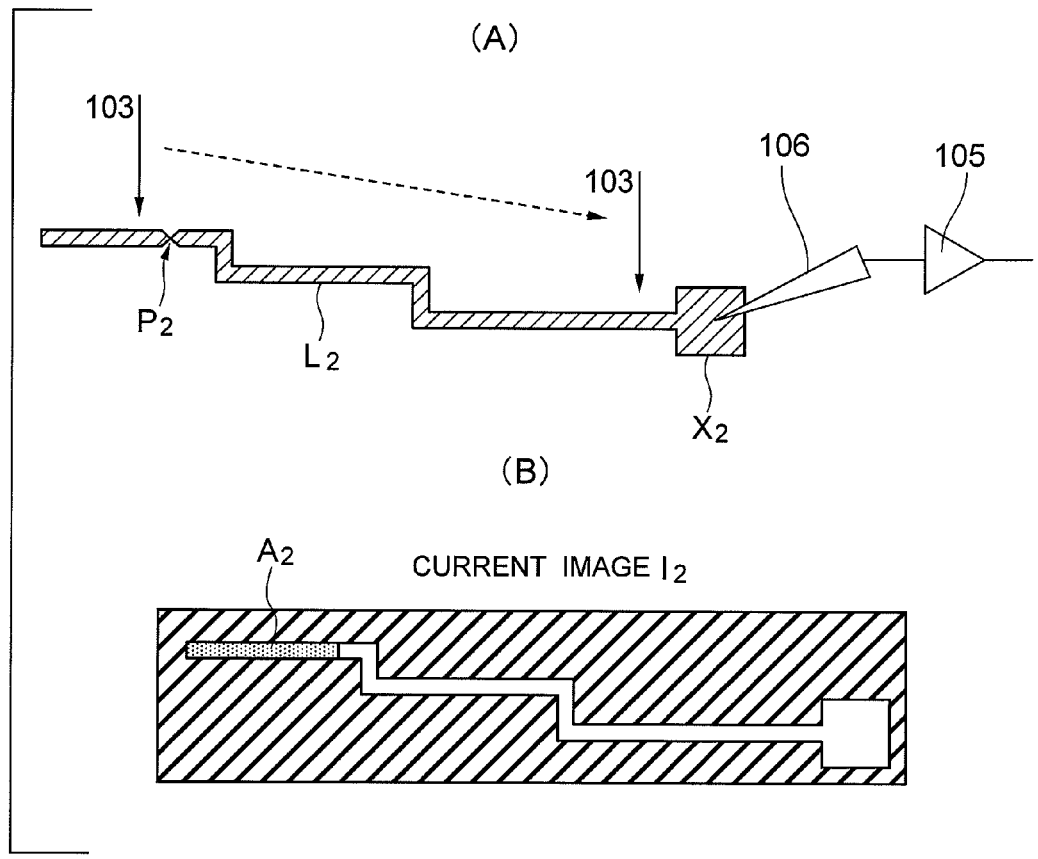
FIG. 3 shows a suspected interconnect including a high resistance open portion and a current image of the interconnect.

FIG. 3 shows a suspected interconnect including a high resistance open portion and a current image of the interconnect.

FIG. 3(A) illustrates a suspected interconnect $L_2$ including a high resistance open portion $P_2$. The high resistance open portion $P_2$ is generated by, for example, the reduced width of the interconnect $L_2$ more than an original width. Moreover, FIG. 3(A) illustrates that the current detection terminal 106 is connected to an end $X_2$ on the suspected interconnect $L_2$, which is then irradiated with the electron beam 103, and therefore, the current generated in the suspected interconnect $L_2$ is detected by the absorbed current amplifier 105.

FIG. 3(B) illustrates a current image $I_2$ generated by the current detection illustrated in FIG. 3(A). In the current detection illustrated in FIG. 3(A), when the interconnect is irradiated with the electron beam 103 on the side of the end $X_2$, as viewed at the failure portion $P_2$, the large amount of current flows at the end $X_2$. In contrast, when the interconnect is irradiated with the electron beam 103 on the side opposite to the end $X_2$, as viewed at the failure portion $P_2$, only the small amount of current can flow at the end $X_2$.

Therefore, an interconnect area $A_2$ which should be ordinarily clearly displayed is blurrily displayed in the current image $I_2$. Here, the interconnect area $A_2$ corresponds to the interconnect located on the side opposite to the end $X_2$, as viewed at the failure portion $P_2$. In this case, the user can specify the failure portion $P_2$ if the contrast between the interconnect area $A_2$ and another interconnect area is high. To the contrary, if the contrast between the interconnect area $A_2$ and another interconnect area is low, the user hardly specifies the failure portion $P_2$.

This will be described with reference to FIG. 4. FIG. 4 is a circuit diagram showing an equivalent circuit of a measurement system for the absorbed current method.

Figure 4:
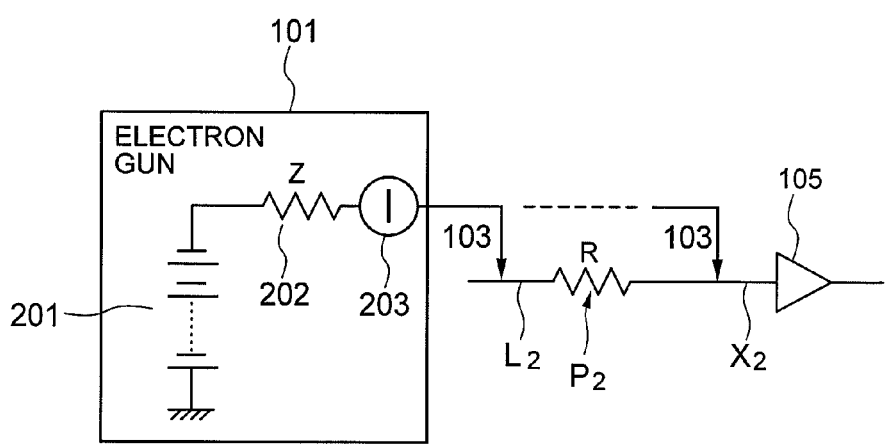
FIG. 4 is a circuit diagram showing an equivalent circuit of a measurement system for an absorbed current method.

As illustrated in FIG. 4, the electron gun 101 is represented as a constant current supply 203 connected to an acceleration voltage 201 and an electric resistance 202, and having a predetermined output impedance Z. In the meantime, the high resistance open portion $P_2$ at the suspected interconnect $L_2$ is represented as a resistance R. Furthermore, moving the position irradiated with the electron beam 103 on the suspected interconnect $L_2$ is equivalent to moving the connection portion between the constant current supply 203 and the suspected interconnect $L_2$.

At this time, in the case where the relationship of $Z \gg R$ is established between the output impedance Z and the resistance R, there is no great difference in amount of current flowing in the amplifier 105, irrespective of the connection of the constant current supply 203 onto the side of the amplifier 105, or onto the side opposite to the amplifier 105 with respect to the resistance R. In other words, as long as the relationship of Z>>R is established, there is no change in contrast on the current image $I_2$ near the high resistance open portion $P_2$, and there is a slight change if there is any change. In this case, it is very difficult to recognize the high resistance open portion $P_2$ on the current image $I_2$.

The general problem experienced by the absorbed current method has been described with reference to FIGS. 2 to 4. Next, the operations or effects of the inspecting apparatus in the present embodiment will be described with reference to FIGS. 5 to 12.

Figure 5:
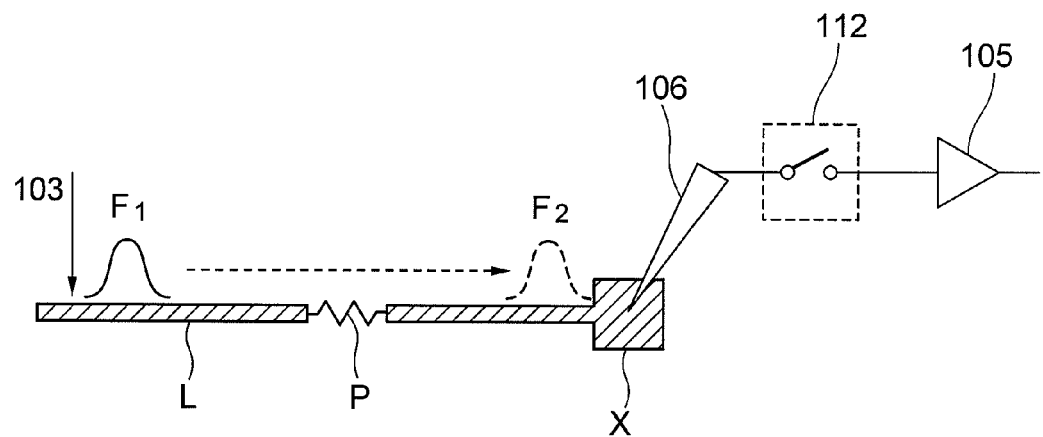
FIG. 5 is a diagram for explaining a method for inspecting the semiconductor device by the apparatus of FIG. 1.

FIG. 5 is a diagram for explaining a method for inspecting the semiconductor device by the inspecting apparatus of FIG. 1.

FIG. 5 illustrates a suspected interconnect L included in the semiconductor device 107 illustrated in FIG. 1. As illustrated in FIG. 5, the suspected interconnect L has a portion P corresponding to a normal or failure portion and an end X. FIG. 5 further illustrates the state in which the current detection terminal 106 connected to the absorbed current amplifier 105 via the gating device 112 is brought into contact with the end X.

In the present embodiment, the electron beam 103, with which the interconnect L is irradiated, is pulsed, and further, a signal to be detected is subjected to gating.

On irradiation of the interconnect L with the pulsed electron beam 103, a current absorbed to the interconnect L also is pulsed. In FIG. 5, the waveform of the pulse current generated at the position irradiated with the electron beam 103 is denoted by reference numeral $F_1$. The pulse current $F_1$ transmits the interconnect L through the portion P, as illustrated by $F_2$, reaches the gating device 112 after a delay time depending on the length of the interconnect. A time interval and a timing of opening the gate (i.e., a gate width and a gate timing) are controlled according to a predetermined rule, described below, in the gating device 112. As a result, only the current passing the gating device 112 reaches the absorbed current amplifier 105 to be detected, and then represented as a current image (absorbed current image).

Figure 6:
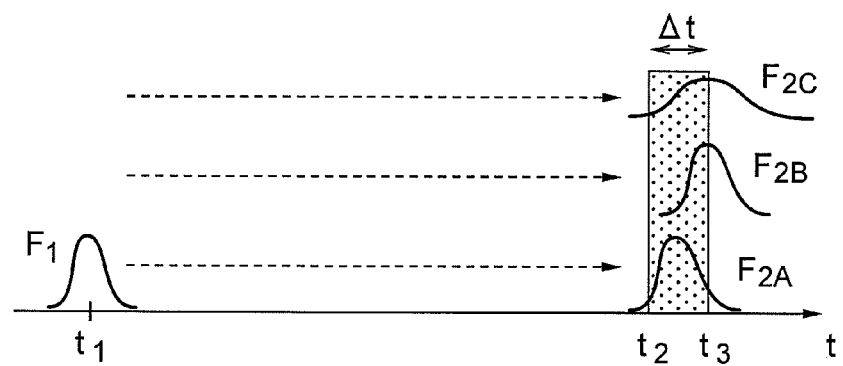
FIG. 6 is a waveform diagram for explaining changes in pulse current in a case where a portion P shown in FIG. 5 is a normal portion or a high resistance open portion.

FIG. 6 is a waveform diagram for explaining changes in pulse current in a case where the portion P shown in FIG. 5 is the normal portion or the high resistance open portion. The lateral axis in FIG. 6 represents a time.

In FIG. 6, the timing of the irradiation of the interconnect L illustrated in FIG. 5 with the electron beam 103 is represented by $t_1$. Moreover, the waveform of the pulse current generated at the position irradiated with the electron beam 103 is represented by $F_1$, like FIG. 5.

The pulse current $F_1$ transmits the interconnect L through the portion P, as indicated by reference numerals $F_{2A}$, $F_{2B}$, and $F_{2C}$. Reference numeral $F_{2A}$ represents a waveform of a pulse current when the portion P is normal. In contrast, reference numerals $F_{2B}$ and $F_{2C}$ represent waveforms of the pulse current when the portion P is the high resistance open portion.

When the portion P is the high resistance open portion, the delay amount of pulse current transmitting the interconnect L is increased or the waveform is enlarged in a time axial direction, as illustrated in FIG. 6. The waveform $F_{2B}$ illustrates an example in which the delay amount is larger than the normal waveform $F_{2A}$, whereas the waveform $F_{2C}$ illustrates an example in which the waveform is enlarged more in the time axial direction than the normal waveform $F_{2A}$.

In FIG. 6, gate opening and closing timings in the gating device 112 are represented by $t_2$ and $t_3$, respectively, and further, the gate width of the gating device 112 is represented by $\Delta t$.

Figure 8:
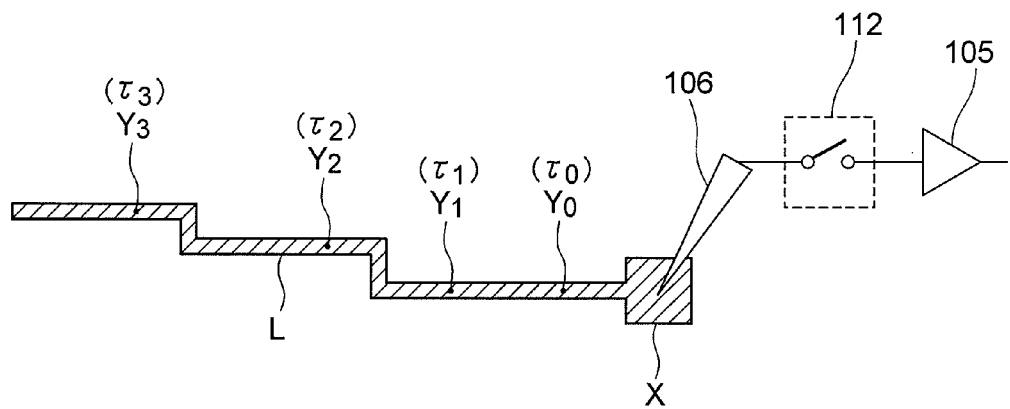
FIG. 8 is a diagram for explaining an example of a method for calculating a delay time of a gating signal with respect to a pulse electron beam generating signal.

In the present embodiment, before the start of the inspection of the interconnect L, the interconnect L near the end X is irradiated with the electron beam 103, and then, the gate width and the gate timing in the gating device 112 are adjusted such that the detected amount of resultant pulse current becomes maximum. In FIG. 8, below described, a portion near the end X is represented by $Y_0$. The width and timing obtained by such adjustment are determined as initial set values of the gate width and the gate timing in the present embodiment.

During the inspection of the interconnect L, many portions on the interconnect L are irradiated with the pulse electron beam 103. In FIG. 8, below described, these portions are exemplified by reference numerals $Y_1$ to $Y_3$. In the present embodiment, when the pulse current generated by the irradiation with the electron beam is detected, the gate width and the gate timing in the gating device 112 are adjusted to the above-described initial set values.

When the gating is performed under such conditions, the detected amounts of pulse currents $F_{2B}$ and $F_{2C}$ become smaller than that of pulse current $F_{2A}$. In other words, the amount of current which can reach the absorbed current amplifier 105 in the case where the pulse current passes the high resistance open portion becomes smaller than that of current which can reach there in the case where the pulse current does not pass there. The reason is that as the delay amount of pulse current or the enlargement of the waveform becomes larger, the gate width and the gate timing optimum for detecting the pulse current are largely shifted from those defined as the initial set values. Therefore, there is a difference in amount of current which can reach the absorbed current amplifier 105 according to whether the pulse current passes the high resistance open portion.

In the present embodiment, the absorbed current generated at the time of the irradiation of the interconnect with the pulsed electron beam 103 is detected while adjusting the gate width and the gate timing in the gating device 112. In this manner, the luminance of a current image pixel in the case where the pulse current does not pass the high resistance open portion and the luminance of a current image pixel in the case where the pulse current passes the high resistance open portion can be greatly varied, thereby clarifying the contrast of the current image on both sides of the high resistance open portion. Therefore, the high resistance open portion can be specified in the present embodiment, unlike in the prior art in which such specifying was difficult.

Although the gate timing can be adjusted, for example, by adjusting the gate opening timing $t_2$ in the present embodiment, it may be adjusted by adjusting other timings. When the gate width $\Delta t$ and the gate opening timing $t_2$ are adjusted to predetermined values, the gate closing timing $t_3$ also can be adjusted to a predetermined value accordingly.

(Details of Generation and Gating of Pulse Current)

Figure 7:
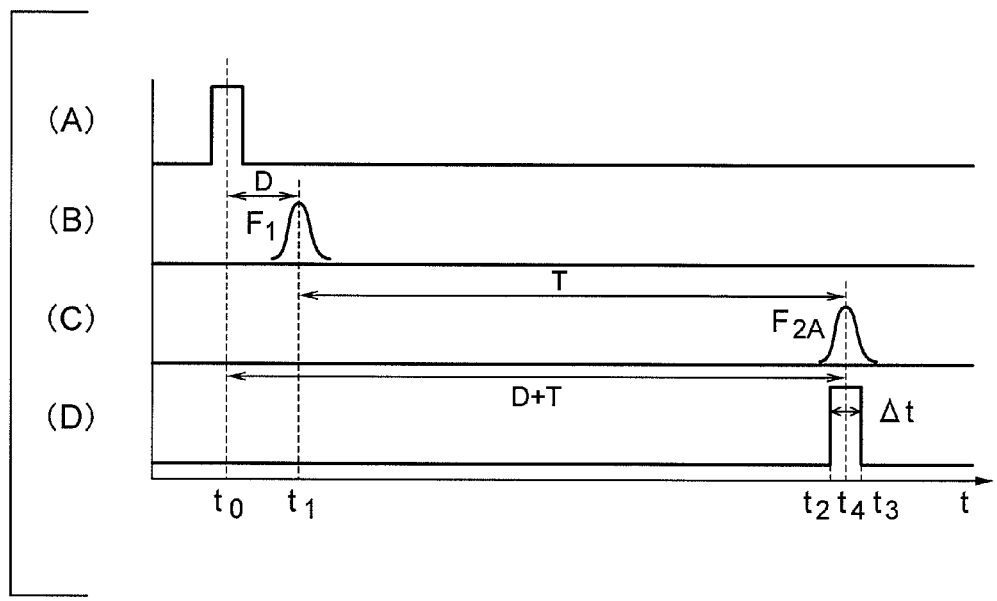
FIG. 7 shows timing charts and waveform diagrams for explaining details of the generation and the gating of the pulse current.

FIG. 7 shows timing charts and waveform diagrams for explaining details of the generation and the gating of the pulse current.

FIG. 7(A) illustrates a signal waveform of a pulse electron beam generating signal for defining a timing for pulsing the electron beam 103. In FIG. 7(A), the generation timing of the pulse electron beam generating signal is represented by $t_0$. The timing $t_0$ represents the intermediate timing between ON and OFF of the pulse electron beam generating signal.

Like in FIG. 6, the timing of the irradiation with the electron beam 103 is represented by $t_1$ in FIG. 7(B), and further, the waveform of the pulse current generated at the position irradiated with the electron beam 103 is represented by $F_1$. When the pulse electron beam generating signal is supplied to the pulse beam generator 111, the interconnect is irradiated with the pulse electron beam 103 with a fixed system delay D (=$t_1$-$t_0$).

When the interconnect is irradiated with the pulse electron beam 103, the pulse current reaches the gating device 112 after the delay time corresponding to the path length from the position irradiated with the pulse electron beam 103 to the gating device 112. In FIG. 7(C), the delay time in the case where there is no high resistance open portion on the path is represented by T. Moreover, the time when the pulse current reaches the gating device 112 is represented by $t_4$ (=$t_1$+T). The waveform of the pulse current reaching the gating device 112 is represented by $F_{2A}$, like in FIG. 6.

In the present embodiment, the gate width and the gate timing in the gating device 112 are adjusted to the initial set values. FIG. 7(D) illustrates the signal waveform of a gating signal for defining the gate width and the gate timing. The ON and OFF timings of the gating signal define a gate opening timing and a gate closing timing, respectively, and are represented by $t_2$ and $t_3$, like in FIG. 6. In addition, the pulse width of the gating signal defines the gate width, and is represented by Δt, like in FIG. 6.

In the present embodiment, the detected amount of pulse current $F_{2A}$ having the normal waveform becomes greater than that of pulse current having an abnormal waveform by adjusting the timing $t_2$ at which the gating signal is turned ON and the gate width Δt to the initial set values. In this manner, the high resistance open portion can be specified in the present embodiment. In the present embodiment, the timing $t_2$ is adjusted to the predetermined timing which is independent of the position irradiated with the electron beam 103 on the interconnect, and further, the difference between the timings $t_2$ and $t_0$ is independent of the irradiation position. Similarly, the gate width Δt also is adjusted to a predetermined value independent of the position irradiated with the electron beam 103 on the interconnect.

In FIG. 7, the timing $t_4$ is the intermediate timing between the ON and OFF timings of the gating signal (i.e., $t_4$=($t_2$+$t_3$)/2). The gate width and the gate timing illustrated in FIG. 7(D) are adjusted such that the detected amount of pulse current $F_{2A}$ illustrated in FIG. 7(C) becomes maximum. In the present embodiment, the intermediate timing $t_4$ may be adjusted in place of the adjustment of the timing $t_2$ at which the gating signal is turned ON. In this case, when the timing $t_4$ is adjusted such that the delay time with respect to the timing $t_0$ becomes D+T, the detected amount of pulse current $F_{2A}$ becomes maximum. The above-described initial set values can be determined by the adjustment.

The delay time D+T is varied according to the position irradiated with the pulse electron beam 103. When inspection is performed by irradiating a certain position with the pulse electron beam 103, the difference between the optimum gating condition for detecting the pulse current generated hereby and the gating condition defined by the initial set values becomes larger as the delay time D+T at that position becomes longer. Here, explanation will be made on a method for calculating the delay time D+T. This method can be used in roughly estimating the gate timing in adopting, for example, a second example (FIG. 11) of a gating method, described below.

FIG. 8 is a diagram for explaining an example of the method for calculating the delay time D+T shown in FIG. 7. The delay time D+T corresponds to a delay time of a gating signal with respect to a pulse electron beam generating signal.

It is considered that a time when the pulse current transmits from the irradiation position of the pulse electron beam 103 to the gating device 112 is proportional to the length of the transmission path in the case where there is no failure portion on the transmission path. Moreover, there is a high possibility that there exists a failure portion from the end X to a portion remote from the end X on the interconnect L. In contrast, there is a low possibility that there exists a failure portion at a portion near the end X from the end X to the portion.

In view of this, the portion $Y_0$ near the end X is first irradiated with the pulse electron beam 103 in the present method. Next, the gate width Δt and gate timing $t_4$ in the gating device 112 are adjusted such that the amount of pulse current generated thereby becomes maximum. The timing $t_4$ is determined, the time $t_4$-$t_0$ is calculated, and then, the calculated time $t_4$-$t_0$ is determined as the delay time D+T at the portion $Y_0$.

In FIG. 8, the delay time D+T at the portion $Y_0$ is represented by $T_0$. In addition, the delay times D+T at other portions $Y_1$, $Y_2$, and $Y_3$ on the interconnect L are represented by $\tau_1$, $\tau_2$, and $\tau_3$, respectively. At the delay time D+T, the time D is a constant independent of the portion on the interconnect L. In contrast, the time T is increased in proportion to the distance between the position on the interconnect L and the gating device 112.

Consequently, when the ratios of the distances between the portions $Y_1$, $Y_2$, and $Y_3$ and the portion $Y_0$ are represented by $r_1$, $r_2$, and $r_3$, respectively, the delay times $\tau_1$, $\tau_2$, and $\tau_3$ can be calculated by taking the sums of the time D occupying the delay time $\tau_0$ and values obtained by multiplying the time T occupying the delay time $\tau_0$ by $r_1$, $r_2$, and $r_3$, respectively. In this manner, the delay times D+T at the portions on the interconnect L can be calculated in the present method.

Here, adjusting the timing $t_4$ may be replaced by adjusting the timing $t_2$ at which the gating signal is turned ON in the present method. Also in this case, both of the constant portion independent of the distance, occupying the delay time $t_2$-$t_0$ and the portion at which the time is increased in proportion to the distance need be taken into consideration. Similarly, the present method is applicable to adjusting timings other than the timings $t_4$ and $t_2$.

Accurately, the time when the pulse current transmits from the position irradiated with the pulse electron beam 103 to the gating device 112 depends on not only the transmission distance but also impedance on the transmission path. Therefore, in the case where the accuracy of the adjustment of the gate width and the gate timing is enhanced, it is desirable to take not only the transmission distance but also impedance on the transmission path into consideration, as required, in calculating the delay time D+T.

Explanation will be made below on an example of a method for adjusting the gate width and the gate timing such that the detected amount of pulse current becomes maximum when the portion $Y_0$ is irradiated with the electron beam 103.
(Method of Scanning by Electron Beam)

Figure 9:
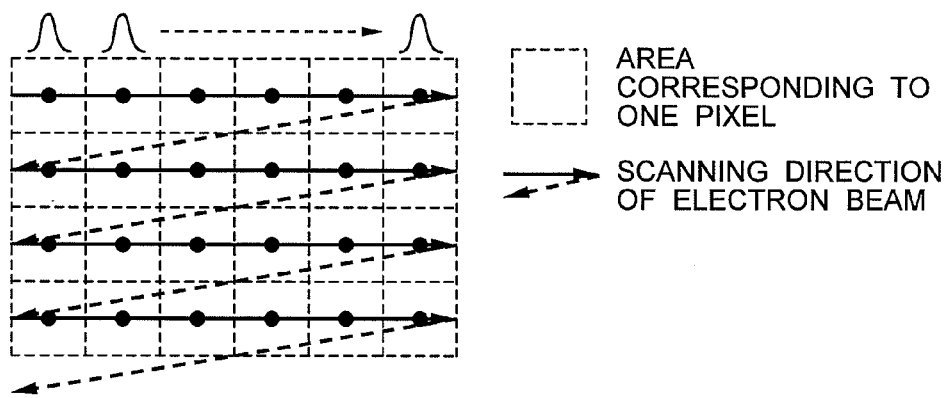
FIG. 9 is a diagram for explaining a method of scanning with an electron beam.

FIG. 9 is a diagram for explaining a method of scanning with the electron beam 103.

Each of square areas illustrated in FIG. 9 represents an area on the semiconductor device 107, corresponding to one pixel of a current image. Each of the areas illustrated in FIG. 9 is displayed as one pixel on the current image. A scanning direction of the electron beam 103 is indicated by arrows in FIG. 9.

The current image includes image data having the total number of pixels determined by the number of vertical pixels multiplied by the number of lateral pixels. A period during which the electron beam 103 remains at the area corresponding to one pixel of the current image is obtained by dividing an image acquirement period by the total number of pixels. For example, assuming that a period required for irradiating 24 areas illustrated in FIG. 9 with the electron beam 103 along the arrows is represented by $T_{24P}$, a period $T_{1P}$ during which the electron beam 103 remains at one area is expressed by $T_{24P}/24$.

In the present embodiment, it is desirable that the failure portion on the current image should be specified with resolution of one pixel. For the purpose of this, each of the areas illustrated in FIG. 9 need be irradiated with the electron beam 103 of one pulse. However, if the pulse width of the electron beam 103 is set to be longer than the period $T_{1P}$, one area cannot be irradiated with the electron beam 103 of one pulse but a plurality of areas is undesirably irradiated.

In view of this, in the present embodiment, the pulse width of the electron beam 103 is set to be shorter than the period $T_{1P}$. In this manner, each of the areas illustrated in FIG. 9 can be irradiated with the electron beam 103 of one pulse. Furthermore, in order to generate the electron beam 103 in a predetermined pulse cycle, the pulse cycle of the electron beam 103 is set to be the period $T_{1P}$ or shorter for the same reason. In this case, it is desirable that the implementation cycle of gating should be synchronized with the pulse cycle of the electron beam 103.

In addition, an image acquirement period may be assumed to be necessarily prolonged or shortened. In such a case, it is desirable to configure the inspecting apparatus (in particular, the pulse beam generator 111) in such a manner as to vary the pulse width or the pulse cycle of the electron beam 103.

In the present embodiment, the processing of irradiating the interconnect with the pulse electron beam 103 and the processing of detecting the pulse current while adjusting the gate width and the gate timing are repeated at each of the areas illustrated in FIG. 9. In this manner, the current image including a plurality of pixels can be generated.

(Examples of Pulse Current Gating Method)

Descriptions will be given below of the gating method for the pulse current by way of two examples. In a first example, the gate timing in the gating device 112 is fixed to the predetermined initial set value, as described above. In contrast, in a second example, the gate timing in the gating device 112 is varied according to the delay amount of pulse current.

Figure 10:
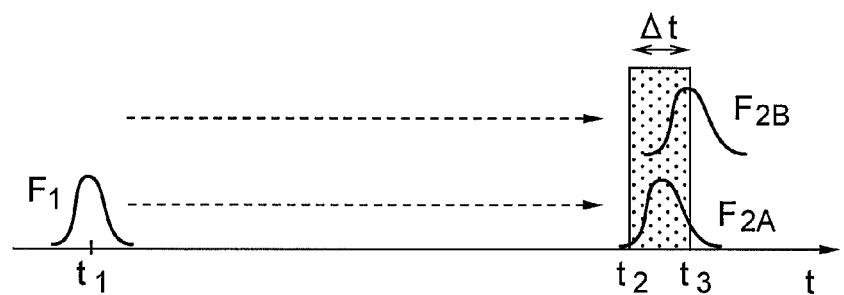
FIG. 10 is a waveform diagram for explaining a first example of a method for gating the pulse current.

FIG. 10 is a waveform diagram showing the first example of the method for gating the pulse current.

In FIG. 10, the timing when the interconnect is irradiated with the electron beam 103 is represented by $t_1$, and further, the waveform of the pulse current generated at the position irradiated with the electron beam 103 is represented by $F_1$, like FIG. 6. Moreover, a waveform of a pulse current reaching the gating device 112 from the irradiation position not through the high resistance open portion is represented by $F_{2A}$. In contrast, the waveform of the pulse current reaching the gating device 112 from the irradiation position through the high resistance open portion is represented by $F_{2B}$.

In the first example, in irradiating the position irradiated with the electron beam 103, the initial set values of the gate width and the gate timing are previously calculated. In other words, the gate width and the gate timing are previously calculated so that the detected amount of pulse current becomes maximum when the interconnect is irradiated near the end of the interconnect with the electron beam 103.

The pulse current is detected while adjusting the gate width and the gate timing to the initial set values when the irradiation position is irradiated with the electron beam 103. The initial set values are constants which cannot be varied even with variations of the position irradiated with the electron beam 103.

Then, the controlling computer 109 generates an image by associating the position irradiated with the electron beam 103 with the detected amount of pulse current, thereby obtaining a current image. The current image expresses the relationship between the position irradiated with the electron beam 103 and the detected amount of pulse current in the form of the image. In the first example, the current image is generated by, for example, modulating the luminance of each of the pixels according to the magnitude of the detected amount of pulse current. The image may be two-dimensionally displayed by assigning a color to each of the pixels in place of modulation of the luminance of each of the pixels.

In this manner, the pulse current is detected while adjusting the gate width and the gate timing to the predetermined initial set values in the first example. Therefore, it is possible to largely vary the current detected amount in the case where the pulse current does not pass the high resistance open portion and the current detected amount in the case where the pulse current passes the high resistance open portion. Consequently, the high resistance open portion appears on the current image as a portion at which the current image is uncontinuously varied, and therefore, the high resistance open portion can be specified.

Figure 11:
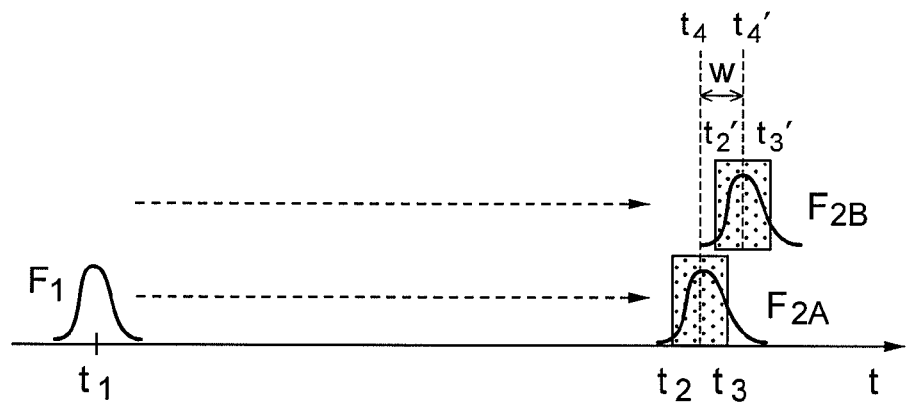
FIG. 11 is a waveform diagram for explaining a second example of the method for gating the pulse current.

FIG. 11 is a waveform diagram for explaining the second example of the method for gating the pulse current.

In FIG. 11, a timing when the interconnect is irradiated with the electron beam 103 is represented by $t_1$, and further, the waveform of the pulse current generated at the position irradiated with the electron beam 103 is represented by $F_1$, like FIG. 10. Moreover, the waveform of the pulse current reaching the gating device 112 from the irradiation position not through the high resistance open portion is represented by $F_{2A}$. In contrast, the waveform of the pulse current reaching the gating device 112 from the irradiation position through the high resistance open portion is represented by $F_{2B}$.

In the second example, when the irradiation position is irradiated with the electron beam 103, the pulse current is actually detected, and then, the gate width and the gate timing are adjusted such that the detected amount becomes maximum. Therefore, a gate timing (i.e., an ON timing) $t_2'$ in detecting the pulse current $F_{2B}$ is later than the gate timing (i.e., the ON timing) $t_2$ in detecting the pulse current $F_{2A}$, as illustrated in FIG. 11. This holds true for OFF timings $t_3$ and $t_3'$ and ON/OFF intermediate timings $t_4$ and $t_4'$. The respective differences between the timings $t_2$, $t_3'$, and $t_4'$ and the timings $t_2$, $t_3$, and $t_4$ are represented by w in FIG. 11.

Therefore, the pulse current $F_{2A}$ is detected while adjusting the gate timing to $t_2$ such that the detected amount becomes maximum. In contrast, the pulse current $F_{2B}$ is detected while adjusting the gate timing to $t_2'$ so that the detected amount becomes maximum.

Then, the controlling computer 109 generates an image by associating the position irradiated with the electron beam 103 with the gate timing of the gating device 112, thereby obtaining a current image. The current image expresses the relationship between the position irradiated with the electron beam 103 and the gate timing of the gating device 112 in the form of an image. In the second example, the current image is generated by, for example, modulating the luminance of each of the pixels according to the value of the gate timing. The image may be two-dimensionally displayed by assigning a color to each of the pixels in place of modulation of the luminance of each of the pixels.

In this manner, in the second example, the pulse current is detected while adjusting the gate width and the gate timing such that the detected amount of pulse current becomes maximum. An image is generated by associating the position irradiated with the electron beam 103 with the gate timing of the gating device 112, thereby obtaining a current image. As a result, the current image is continuously varied at the normal portion whereas it is uncontinuously varied at the high resistance open portion. Therefore, the high resistance open portion can be specified.

In the second example, the gate width may be constant irrespectively of the position irradiated with the electron beam 103 or may be varied according to the position irradiated with the electron beam 103. In the former case, the pulse current is detected by adjusting the gate width to a fixed value and adjusting the gate timing such that the detected amount of pulse current becomes maximum. In the latter case, the pulse current is detected while adjusting the gate width and the gate timing such that the detected amount of pulse current becomes maximum.

In the second example, imaging the adjusted gate timing per se may be replaced by imaging a difference between the adjusted gate timing and the normal gate timing. In the case of the pulse current $F_{2A}$, the timing difference is 0 (=$t_2$−$t_2$), and further, in the case of the pulse current $F_{2B}$, the timing difference is w (=$t_2'$−$t_2$).

In the case where the difference in gate timing is imaged, the current image becomes uniform at the normal portion whereas the current image is uncontinuously varied at the high resistance open portion. In contrast, in the case where the gate timing per se is imaged, the current image is continuously varied at the normal portion whereas it is uncontinuously varied at the high resistance open portion.

In the first example, since the gate width and the gate timing are fixed to the initial set values, the current image is continuously varied at the normal portion whereas it is uncontinuously varied at the high resistance open portion, like in the second example.

As described above, in the present embodiment, the pulse current is detected while adjusting the opening/closing of the gate in the gating device 112. The current image is generated by imaging the relationship between the position irradiated with the electron beam 103 and a parameter relating to the pulse current. Although examples of such a parameter include the detected amount of pulse current and the gate timing in gating the pulse current in the first and second examples, the parameter is not limited to the examples. With the above-described processing, the high resistance open portion can be specified in the present embodiment.

The current amount of pulse current generated at the position irradiated with the electron beam 103 may depend on the interconnect layer of a multi-layer interconnect structure in the actual semiconductor device 107. In this case, even if the gate width and the gate timing in detecting the pulse current are equal between layers, the luminance of a pixel corresponding to the pulse current is different between the layers. In this case, the current image is influenced by the difference in layer in imaging the current value. In contrast, there is an advantage that the current image is not influenced by the difference in layer in imaging the gate timing in the second example.

(Example of Method for Adjusting Gate Width and Gate Timing)

Here, a description will be given of an example of a method for adjusting the gate width and the gate timing such that the detected amount of pulse current becomes maximum when the portion $Y_0$ (FIG. 7) is irradiated with the electron beam 103. This method may be applicable also to the adjustment of the gate width and the gate timing in detecting the pulse current $F_{2A}$ or the pulse current $F_{2B}$ in the second example illustrated in FIG. 11.

Figure 12:
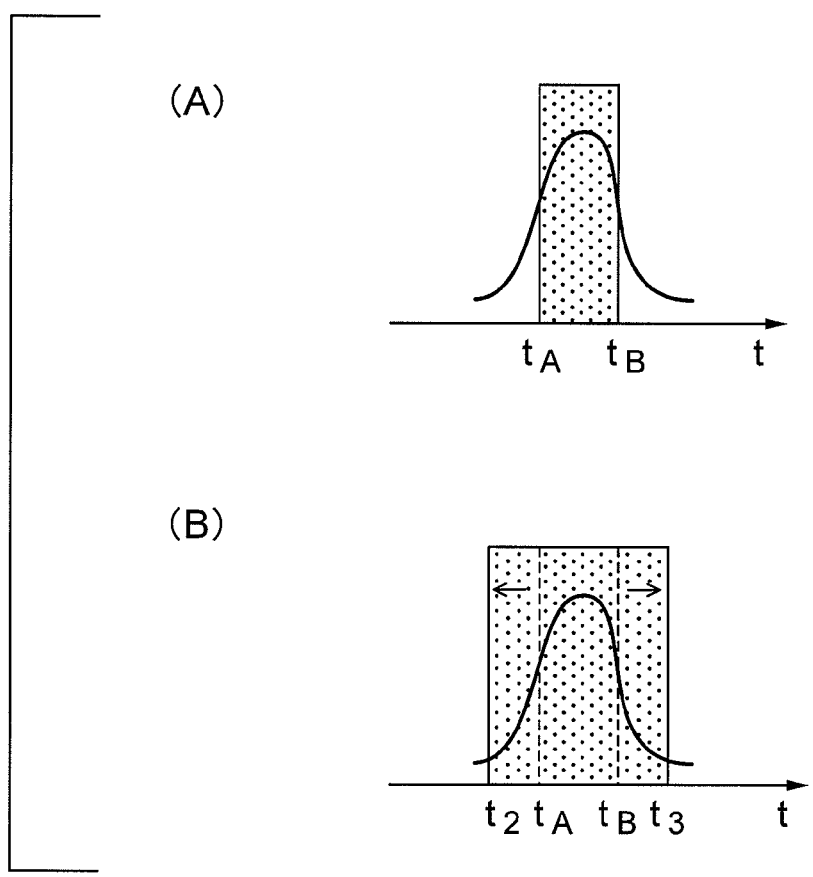
FIG. 12 shows waveform diagrams for explaining an example of a method for adjusting a gate width and a gate timing.

FIG. 12 shows waveform diagrams for explaining an example of a method for adjusting the gate width and the gate timing.

First, a temporary value $t_A$ of a gate opening timing and a temporary value $t_B$ of a gate closing timing are set, as illustrated in FIG. 12(A). At this time, the value $t_B$-$t_A$ is set to a value shorter than a pulse width of a pulse current which reaches the gating device 112, for example, about a half of a pulse width of a pulse current which reaches the gating device 112. In addition, the timings $t_A$ and $t_B$ are set under the condition that the value $t_B$-$t_A$ is set such that the detected amount of pulse current becomes maximum. The pulse width of the pulse current can be determined by determining a rough value with respect to an incident pulse width after previous observation by an oscilloscope or the like.

After the timings $t_A$ and $t_B$ are determined, the gate width is enlarged, as illustrated in FIG. 12(B). The gate width is enlarged until the detected amount of pulse current is not increased. After the gate width is enlarged, the timing $t_A$ is moved to the gate opening timing $t_2$ whereas the timing $t_B$ is moved to the gate closing timing $t_3$. Here, the timings $t_2$ and $t_3$ are set by varying the temporary values $t_A$ and $t_B$ to enlarge the gate width while keeping the value $(t_A+t_B)/2$ which is an intermediate timing between the temporary values $t_A$ and $t_B$.

As a result, the gate width and the gate timing illustrated in FIG. 12(B) are set to such a width and a timing that the detected amount of pulse current becomes maximum, respectively.

As described above, in the present embodiment, the interconnect is irradiated with the pulsed electron beam 103, and then, the resulting current generated inside of the interconnect is detected by the absorbed current amplifier 105 while adjusting the opening/closing of the gate in the gating device 112. In this manner, the current images on both sides of the high resistance open portion can be uncontinuously varied. Therefore, the high resistance open portion can be specified in the present embodiment.

The present embodiment may be applied to other electronic components having interconnects in place of the inspection of the semiconductor device 107. Examples of such electronic components include a liquid crystal panel.

Further, the semiconductor device 107 which is inspected in the present embodiment may be a semiconductor device 107 in the form of a wafer or a diced chip as long as a probe needle can be brought into contact with the semiconductor device 107.

As described above, the embodiments of the disclosure can provide the method and the apparatus for inspecting the electronic component so as to make it possible to specify the high resistance open portion.

While certain embodiments have been described, these embodiments have been presented by way of example only, and are not intended to limit the scope of the inventions. Indeed, the novel methods and apparatuses described herein may be embodied in a variety of other forms; furthermore, various omissions, substitutions and changes in the form of the methods and apparatuses described herein may be made without departing from the spirit of the inventions. The accompanying claims and their equivalents are intended to cover such forms or modifications as would fall within the scope and spirit of the inventions.

The invention claimed is:
1. A method for inspecting an electronic component, the method comprising:

pulsing an electron beam and irradiating an interconnect of an electronic component electrically connected to a current detection terminal with the electron beam;

detecting, by a current detector which is electrically connected to the current detection terminal via a gating device, a current generated when the interconnect is irradiated with the electron beam, while adjusting an opening and a closing of a gate in the gating device; and generating a current image expressing a relationship between a position irradiated with the electron beam and the current detected by the current detector, wherein the current generated by the electron beam is detected while adjusting a gate timing of the gate based on a detected amount of the current so that the detected amount of the current becomes maximum, and the current image expresses the relationship between the position irradiated with the electron beam and the gate timing at which the detected amount of the current becomes maximum.

2. The method of claim 1, wherein
the current image is generated by varying luminance or color of each pixel of the current image according to the gate timing.

3. The method of claim 1, wherein
the gate timing is adjusted while keeping a gate width constant.

4. The method of claim 1, wherein
the current is detected while adjusting a gate width and the gate timing based on the detected amount of the current so that the detected amount of the current becomes maximum.

5. An apparatus for inspecting an electronic component, the apparatus comprising:

a current detection terminal configured to be electrically connected to an interconnect of the electronic component;

a current detector electrically connected to the current detection terminal, and configured to detect a current generated in the interconnect;

a gating device provided between the current detection terminal and the current detector, and configured to switch an opening and a closing of a gate so as to control whether or not the current is allowed to pass through the gate;

an electron gun configured to generate an electron beam;

a pulse beam generator configured to pulse the electron beam; and a gating adjustor configured to adjust the opening and the closing of the gate in the gating device and to adjust a gate timing of the gate based on a detected amount of the current such that the detected amount of the current at the current detector is maximum when the interconnect is irradiated with the pulsed electron beam.

* * * * *